(12) United States Patent
Park

(10) Patent No.: US 8,120,129 B2
(45) Date of Patent: Feb. 21, 2012

(54) IMAGE SENSOR AND METHOD OF MANUFACTURING THE SAME

(75) Inventor: Seung Ryong Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 148 days.

(21) Appl. No.: 12/555,411

(22) Filed: Sep. 8, 2009

(65) Prior Publication Data

US 2010/0072568 A1     Mar. 25, 2010

(30) Foreign Application Priority Data

Sep. 23, 2008 (KR) .................. 10-2008-0093349

(51) Int. Cl.
*H01L 31/0232* (2006.01)
(52) U.S. Cl. ............................... 257/432; 257/E31.127
(58) Field of Classification Search .............. 257/432, 257/E31.127; 438/69
See application file for complete search history.

(56) References Cited

U.S. PATENT DOCUMENTS

| | | | |
|---|---|---|---|
| 6,171,885 B1 * | 1/2001 | Fan et al. | 438/70 |
| 7,076,125 B2 * | 7/2006 | Kouta et al. | 385/14 |
| 7,709,914 B2 * | 5/2010 | Lee | 257/432 |
| 2007/0045513 A1 * | 3/2007 | Lee et al. | 250/208.1 |
| 2007/0063126 A1 * | 3/2007 | Lee | 250/208.1 |
| 2008/0164552 A1 * | 7/2008 | Hwang | 257/432 |
| 2009/0115875 A1 * | 5/2009 | Choi et al. | 348/294 |

FOREIGN PATENT DOCUMENTS

KR    10-2007-0071025 A    7/2007

OTHER PUBLICATIONS

Sung Gyu Pyo and Jun Ho Yoon; "Method for Fabricating a Metal Interconnection of a CMOS Image Sensor to Avoid Plasma Damage"; Korean Patent Abstracts; Publication No. 1020070071025 A; Publication Date: Jul. 4, 2007; Korean Intellectual Property Office, Republic of Korea.

* cited by examiner

*Primary Examiner* — Allan R Wilson
(74) *Attorney, Agent, or Firm* — The Law Offices of Andrew D. Fortney; Andrew D. Fortney; Bradley J. Levang

(57) ABSTRACT

An image sensor and a method of manufacturing the same are disclosed. The image sensor includes a plurality of photodiodes on a substrate, an dielectric layer on the plurality of the photodiodes, a metal line layer in the dielectric layer corresponding to a border region between neighboring photodiodes, the metal line layer having a curved backside, a color filter layer on the dielectric layer, and a microlens on the color filter layer.

15 Claims, 7 Drawing Sheets

IMAGE SENSOR AND METHOD OF MANUFACTURING THE SAME

CROSS REFERENCE TO RELATED APPLICATION

This application claims the benefit of the Patent Korean Application No. 10-2008-0093349, filed on Sep. 23, 2008, which is hereby incorporated by reference as if fully set forth herein.

BACKGROUND OF THE DISCLOSURE

1. Field of the Disclosure

The present invention relates to a semiconductor device and an apparatus for manufacturing the same, more particularly, to a CMOS image sensor and a method of and apparatus for manufacturing the same.

2. Discussion of the Related Art

In general, image sensors are semiconductor devices that convert optical images into electrical signals. Image sensors may be categorized into a charge coupled device (CCD) type and a complementary metal-oxide-silicon (CMOS) type. The image sensor includes a light receiving region having a photodiode for sensing incident light and a logic region for processing the sensed light into an electric signal for data formation.

FIG. 1 is a cross-sectional view illustrating a conventional CMOS image sensor. According to the conventional CMOS image sensor shown in FIG. 1, a light receiving region having a photodiode is illustrated, but not an entire logic region.

In reference to FIG. 1, the conventional image sensor includes a plurality of photodiodes 113 formed on a substrate 110, one or more interlayer dielectric layers 115 formed on the photodiodes 115, a planarization layer 130 formed on the interlayer dielectric 115, a color filter layer 140 formed on the planarization layer 130 having a plurality of color filters, each corresponding to an underlying photodiode 115, and a microlens 150 formed on each color filter in the color filter layer 140. Here, the interlayer dielectric 115 has a plurality of metal line layers 120.

Generally, light 105 passes through the microlens 150, the color filter layer 140 and the interlayer dielectric 115 sequentially. The light reaches the photodiode 115 corresponding to the microlens 150. The light having reached the photodiode 115 is absorbed in the substrate 110, and the absorbed light is converted into an electric signal.

The refractive index of silicon forming the photodiode 115 is approximately 4~5 in a visible ray region. About 20~30% of the light 105 that reaches the photodiode 115 may be reflected. Sensitivity of the image sensor may be less than optimum because the light 105 is reflected and scattered by the metal line layer 120. In addition, the light reflected and scattered by the metal line layer 120 may enter a neighboring photodiode and cause crosstalk.

SUMMARY OF THE DISCLOSURE

Accordingly, the present invention is directed to a semiconductor image sensor and a method of manufacturing the image sensor.

An object of the present invention is to provide an image sensor that is able to enhance sensitivity thereof and to prevent crosstalk.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structures particularly pointed out in the written description and claims hereof as well as the appended drawings.

To achieve these objects and other advantages and in accordance with the purposes of the invention, as embodied and broadly described herein, an image sensor includes a plurality of photodiodes on or in a substrate; a dielectric layer on the plurality of the photodiodes; a metal line layer on or in the dielectric layer corresponding to a border region between two neighboring photodiodes, the metal line layer comprising a backside having a curved structure; a color filter layer on the dielectric layer; and a microlens on the color filter layer.

In another aspect of the present invention, a method of manufacturing an image sensor includes steps of forming a plurality of photodiodes on a substrate; forming a first dielectric layer over the plurality of the photodiodes, the first dielectric layer having a convex shape; forming a metal line layer on the convex shaped first dielectric layer; forming a first metal line layer having a convex curved backside on the first dielectric layer, corresponding to a border region between two neighboring photodiodes, by patterning the metal line layer; and forming a second dielectric layer on the first dielectric layer and the first metal line layer.

The image sensor according to embodiments of the present invention re-reflects the light reflected away from one of the photodiodes back to the photodiode by the backside (e.g., the underside or lowermost two-dimensional surface facing the photodiode) of the metal line layer to enhance sensitivity. In addition, the present image sensor prevents the light reflected by or away from the photodiodes from being reflected to another adjacent photodiode, thus preventing crosstalk.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
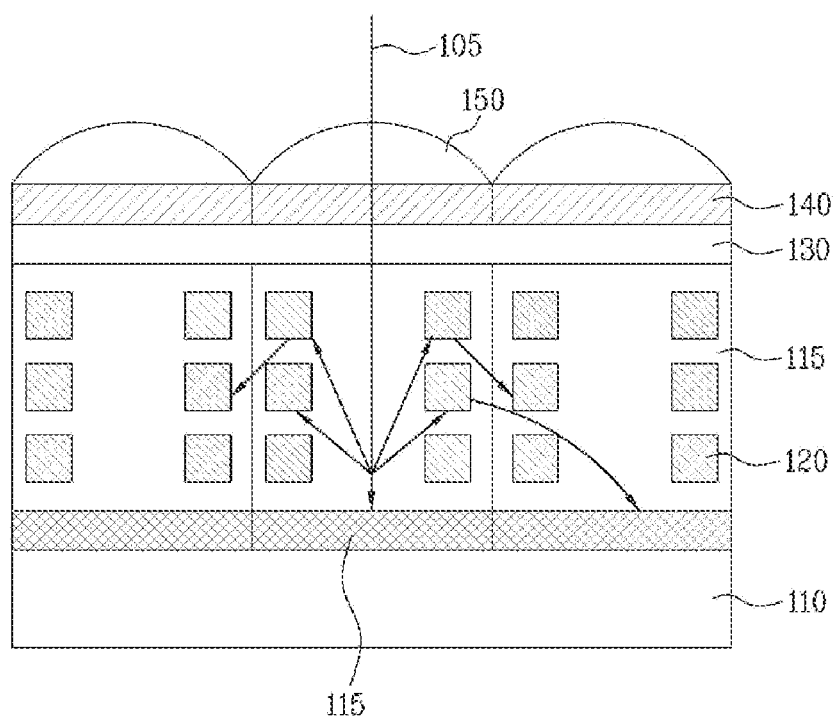
FIG. 1 is a cross-sectional view illustrating a conventional CMOS image sensor.
Figure 2:
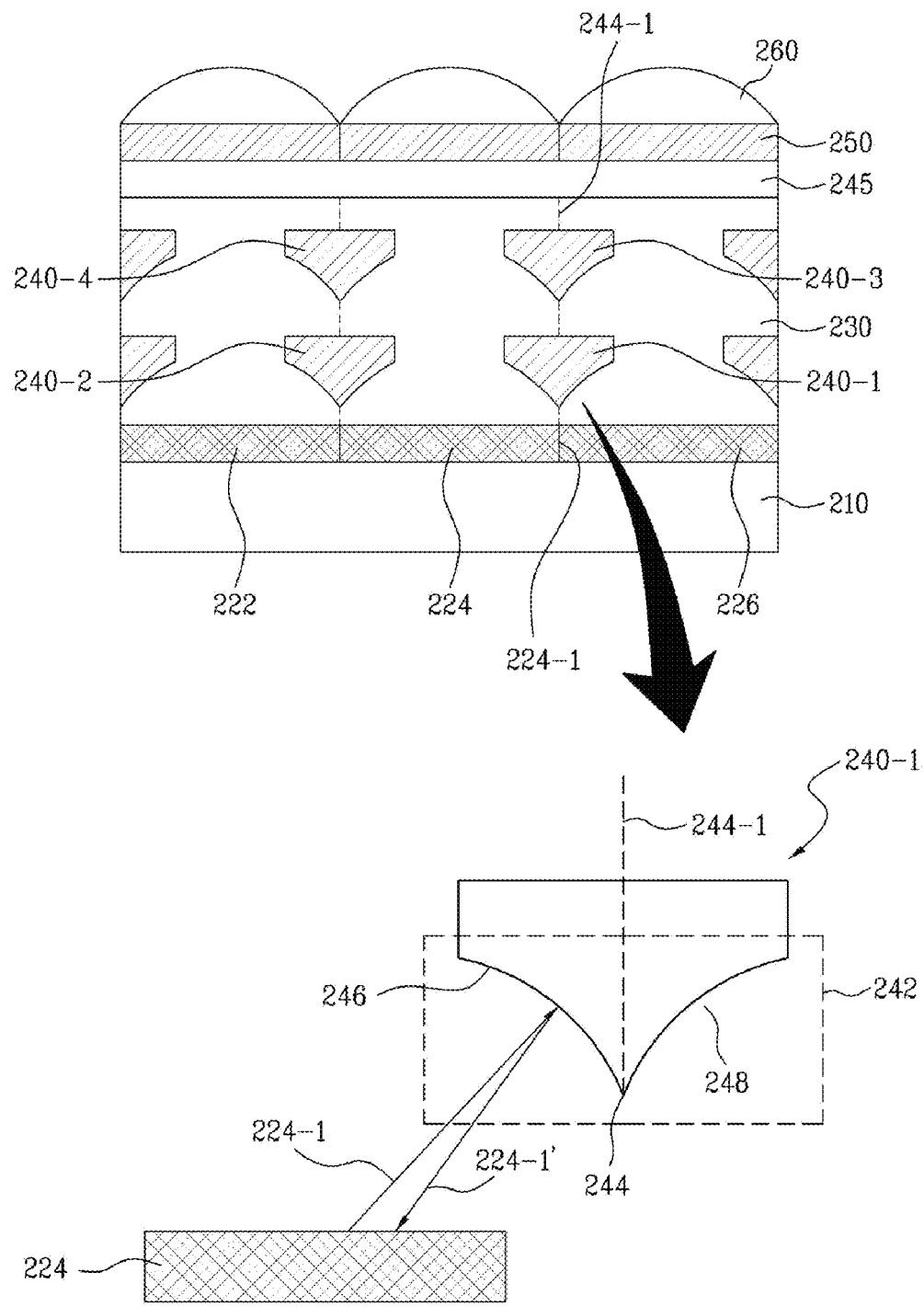
FIG. 2 is a cross-sectional view illustrating an exemplary image sensor according to embodiment(s) of the present invention.

FIG. 2 is a cross-sectional view illustrating an exemplary image sensor according to embodiments of the present invention. In reference to FIG. 2, the image sensor (for example, an CMOS image sensor) includes a substrate 210, a plurality of photodiodes 222, 224 and 226 on the substrate 210, one or more interlayer dielectric layers 230 including metal line layers 240-1 through 240-4, a planarization layer 245 on the interlayer dielectric layer(s) 230, a color filter layer 250 on the planarization layer 245, containing a plurality of color filters each corresponding to a unique one of the plurality of the photodiodes 222, 224 and 226, and a microlens 260 on a color filter of the color filter layer 250.

In various embodiments, the interlayer dielectric layer 230 comprises a plurality of dielectric layer stacks (not shown in FIG. 2). For example, each dielectric layer stack may support a blanket-deposited metal layer (e.g., metal layer 325 in FIG. 3E) that, after photolithographic patterning, forms a metal line layer (e.g., 240-1, 240-2, 240-3 or 240-4). Each dielectric layer stack may comprise one or more of the following: an etch stop layer (e.g., silicon nitride), a lower buffer layer (e.g., silicon-rich oxide [for example of the formula $SiO_{1.8-1.9}$] or a silicon dioxide such as plasma silane-based silicon dioxide), a bulk dielectric (e.g., silicon dioxide, undoped [for example, undoped silicate glass or USG] or doped with fluorine [for example, fluorosilicate glass or FSG], boron and/or phosphorous [for example, borosilicate glass (BSG), phosphosilicate glass (PSG), or borophosphosilicate glass (BPSG)], or carbon [optionally with hydrogen; e.g., silicon oxycarbide (SiOC) or hydrogenated silicon oxycarbide (SiOCH), including the so-called "black diamond" insulator(s)]), an upper buffer layer (e.g., a silicon dioxide such as a TEOS [tetraethyl orthosilicate]-based silicon dioxide), and a capping layer (e.g., a silicon dioxide, such as USG or a plasma silane-based silicon dioxide, and/or silicon nitride).

Metal line layers 240-1 through 240-4 may comprise one or more of the following: an adhesive layer (e.g., Ti or Ta), a barrier layer (e.g., TiN, TaN, TiSiN, or TaSiN), a bulk conductor such as aluminum (Al) or an Al alloy (e.g., containing 0.5-4 wt. % Cu, 0.1-25 wt. % Ti and/or 0.5-2.0 wt. % Si), an upper adhesive and/or planarization layer (e.g., Ti) and/or an anti-reflective and/or hillock suppression layer (e.g., TiN, TiW alloy, etc.). For example, the metal layer 240-1, 240-3 may comprise a stacked Ti/TiN/Al alloy/Ti/TiN structure. The metal line layers 240-1 through 240-4 may or may not be electrically connected to other electrically active structures in the image sensor.

The color filter layer 250 generally contains a plurality of color filters. In one example, color filter layer 250 includes red, green and blue color filters. Alternatively, color filter layer 250 may include yellow, cyan and magenta color filters.

Each microlens 260 may be on a unique color filter of the color filter layer 250, over a unique photodiode. In other words, the microlenses 260, color filters, and photodiodes 222, 224 and 226 may be in a 1:1:1 relationship.

The substrate 210 may include shallow trench isolation structures (not shown) to isolate the photodiodes 222, 224 and 226 and/or the individual pixels of the image sensor.

Backsides (e.g., bottom or lowermost surfaces) 242 of the metal line layers 240-1 to 240-4 have curvatures toward the plurality of the photodiodes 222, 224 and 226, respectively, to re-reflect light reflected by the photodiodes 222, 224 and 226. That is, the surfaces of the backside 242 are convex inward, or concave.

For example, the backside 242 of the first metal line layer 240-1 includes at least two curved surfaces 246 and 248 and at least one (e.g., a single) apex 244. Here, the curved surfaces 246 and 248 may be convex inward, or concave. The inward-convex curved surfaces 246 and 248 may meet each other at the apex 244. However, a group of four microlenses 260 arranged in a 2×2 matrix may define a center point at the corners where the four microlenses 260 meet. A group of four concave surfaces extend away such a center point, generally one such concave surface in each of four equal quadrants. A metal line (e.g., 240-1) may include one or a plurality of such center points in a single line. Furthermore, such a line (e.g., 240-1) may be linear, branched (e.g., containing one or more branches which may extend at an angle of, e.g., 90° from a primary line) or bent (e.g., containing one or more sections at an angle of, e.g., 90° with respect to one another).

The curved surfaces 246 and 248 are generally symmetric to each other with respect to a vertical line 244-1 passing through the apex 244. Also, the vertical line 244-1 passing through the apex 244 may be aligned to a border surface or region 224-1 between adjacent photodiodes 224 and 226.

Specifically, a first curved surface 246 of the backside 242 of the metal line layer 240 may be concave to a first direction. Here, the first direction is from a first photodiode 224 to the metal line layer 240-1. A second curved surface 248 of the backside 242 of the metal line layer 240 may be concave to a second direction. Here, the second direction is from a second photodiode 226 to the metal line layer 240-1.

The metal line layers 240-1 to 240-4 having the above backsides 242 may be in the interlayer dielectric 230 as single layer, or as multiple layers in a direction perpendicular to the substrate 210.

The light reflected by the plurality of the photodiodes 222, 224 and 226 may be re-reflected to the plurality of the photodiodes 222, 224 and 226 by the backsides of the metal line layers 240-1 to 240-4. For example, light 224-2 reflected by the first photodiode 224 may be re-reflected to the first photodiode 224 by the backside 242 of the metal line layer 240-1 adjacent to the first photodiode 224. Some of the re-reflected light 224-3 may be absorbed by the first photodiode 224 and some of the re-reflected light may be reflected again. Through the repetition of this process, the amount of the light absorbed to the first photodiode 224 increases enough to improve the sensitivity of the image sensor.

Furthermore, the backside 242 of the metal line layer (for example, 240-1) has a concave curvature, and the light 224-1 reflected by the first photodiode 224 is re-reflected to the first photodiode 224, not to the photodiodes 222 and 226 adjacent to the first photodiode 224, such that crosstalk may be prevented.

FIGS. 3A to 3I are cross-sectional views illustrating exemplary structures made by various steps in exemplary embodiments of a method of manufacturing the above image sensor.

Figure 3A:
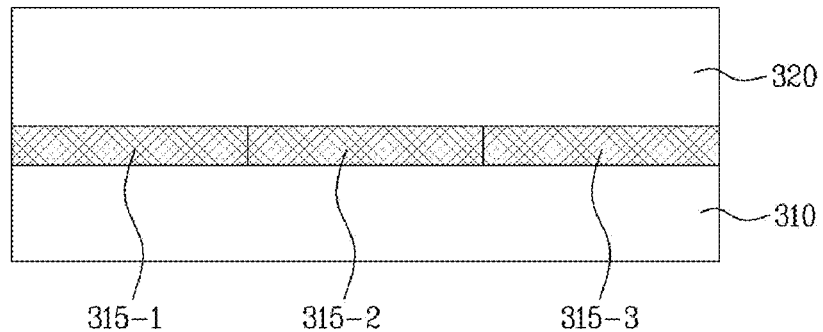
FIGS. 3A to 3I are cross-sectional views illustrating exemplary structures formed by process steps during manufacturing the image sensor according to embodiments of the present invention.

As shown in FIG. 3A, a plurality of photodiodes 315-1, 315-2 and 315-3 are formed on or in a substrate 310. For example, an n type impurity ion, such as arsenic (As) or phosphorus (P), is implanted into selected or predetermined regions of a surface of the substrate 310 between (i) the gate of a transfer transistor (not shown) previously formed on the substrate 310 in the same unit pixel and (ii) a shallow trench isolation structure (not shown) that may define the border of the unit pixel, such that the plurality of the photodiodes 315-1, 315-2 and 315-3 are formed. Here, the plurality of the photodiodes 315-1, 315-2 and 315-3 may include multiple layers, comprising an n-type ion implantation region and a p-type ion implantation region having a depth shallower than that of the n-type ion implantation region, formed sequentially in the substrate 310.

Hence, a first dielectric 320 is formed on the substrate 310 having the photodiodes 315-1, 315-2 and 315-3 formed thereon. The first dielectric 320 may be as described above for a dielectric layer stack in the interlayer dielectric layer 230 (FIG. 2)

Figure 3B:
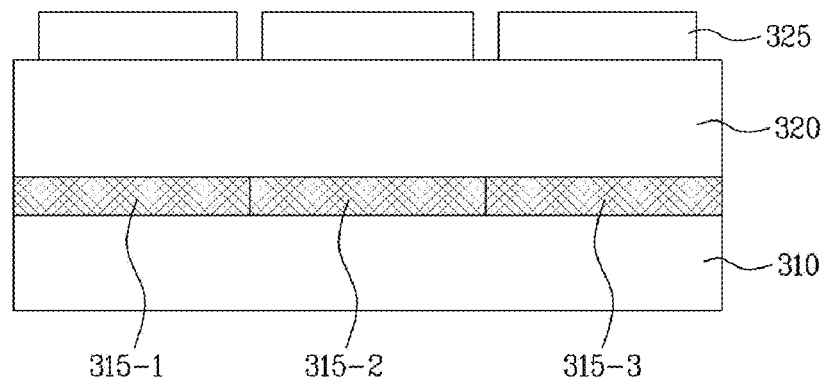

Then, as shown in FIG. 3B, a first photoresist pattern 325 is formed on the first dielectric 320 by spin-on coating, then it is patterned by a photolithography process. The first photoresist pattern 325 may be patterned corresponding to the plurality of the photodiodes 315-1, 315-2 and 315-3. For example, after the photoresist is coated on the first dielectric 320, the coated photoresist (not shown) is exposed and developed using a mask (not shown) for forming a microlens (e.g., microlens 260 in FIG. 2) of the image sensor such that the first photoresist pattern 325 may be formed. Here, the first photoresist pattern 325 may be patterned so as to expose a predetermined region of the first dielectric 320 corresponding to a border region between neighboring photodiodes.

Figure 3C:
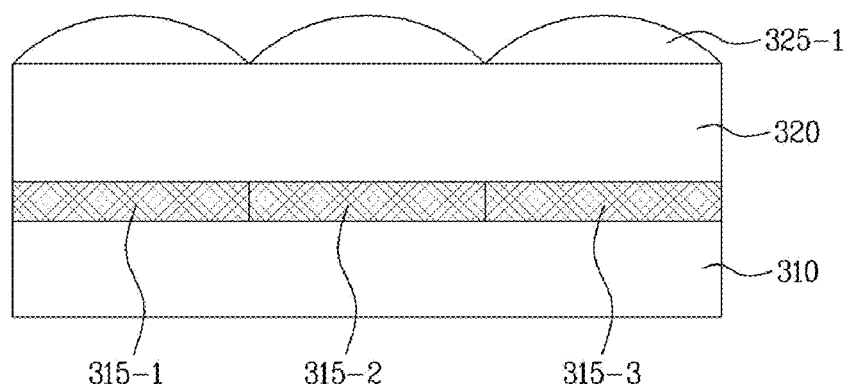

Hence, as shown in FIG. 3C, the first photoresist pattern 325 is heated to form a first convex photoresist pattern 325-1 in a reflow process. Here, the reflow process thermally flows the first photoresist pattern 325 at a first elevated temperature (e.g., from about 150° C. to about 250° C.), and it is then hardened through baking (e.g., at a higher temperature such as greater than or equal to about 300° C. to about 350° C.), to form the first convex photoresist pattern 325-1.

The first convex photoresist pattern 325-1 corresponding to each of the photodiodes has a convex center region. At this time, an edge region of the first convex photoresist pattern 325-1 between neighboring photodiodes may be sharp.

Figure 3D:
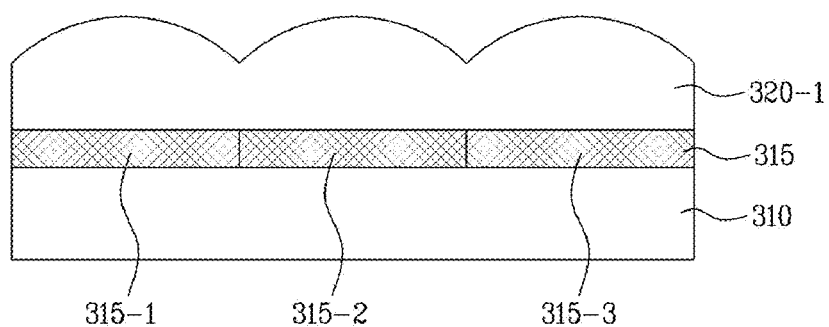

As shown in FIG. 3D, an etch-back process is performed on the first convex photoresist pattern 325-1 and the first dielectric 320 thereunder. In the etch-back process, the first convex photoresist pattern 325-1 and the first interlayer dielectric 320 may be nonselectively etched (e.g., such that the relative etch rates of the first convex photoresist pattern 325-1 and the first interlayer dielectric 320 are about 1:1). The first convex photoresist pattern 325-1 is removed by the above etch-back, and the first interlayer dielectric 320 may be etched partially to have a substantially identical profile to the first convex photodiode pattern 325-1. That is, the first interlayer dielectric 320-1 having a plurality of convex shapes corresponding to the photodiodes 315-1, 315-2 and 315-3 may be formed.

The center region of the convex lens-shaped first interlayer dielectric 320-1 corresponding to each of the photodiodes is convex, and the edge region(s) of the first interlayer dielectric 325-1 corresponding to a border region (or interface) between neighboring photodiodes is sharp.

Figure 3E:
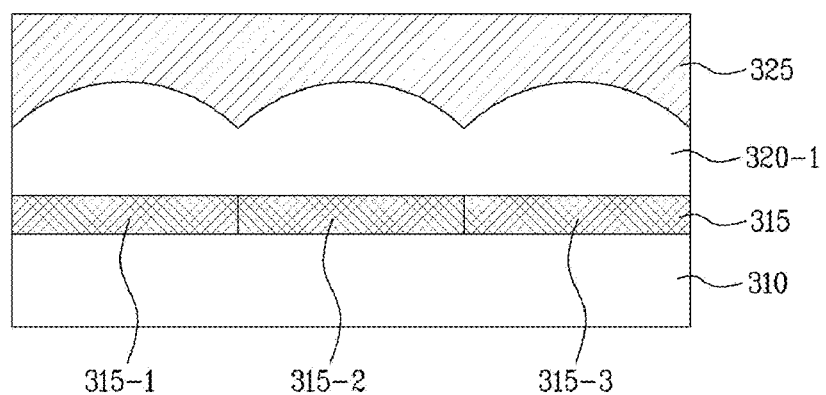

Hence, as shown in FIG. 3E, a metal layer 325 is formed on the first interlayer dielectric 325-1. The metal layer 325 may be as described for metal line layers 240-1 through 240-4 (FIG. 2), and be formed by physical vapor deposition (PVD; e.g., sputtering or evaporation) or chemical vapor deposition (CVD). The metal layer 325 may be planarized by, e.g., a chemical mechanical polishing (CMP) process.

Figure 3F:
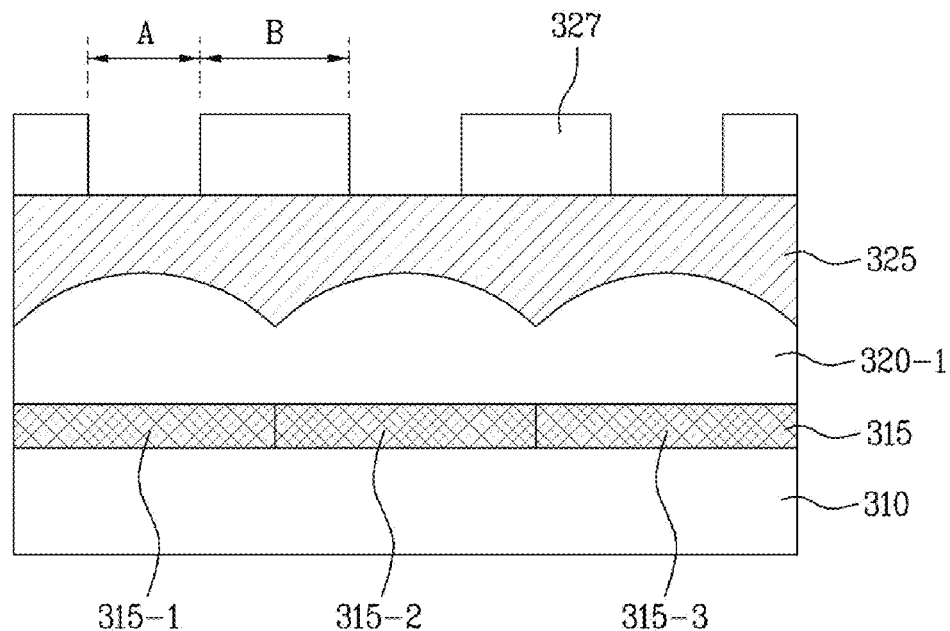

As shown in FIG. 3F, a second photoresist pattern 327 is formed on the planarized metal layer 325, generally by spin-coating and a photolithography process. The second photoresist pattern 327 is patterned to expose one or more predetermined regions of the metal layer 235 corresponding to the center region (A) of the first interlayer dielectric 320-1 (e.g., having a plurality of convex lens-shaped structures therein) and to cover another region corresponding to the edge or border region(s) (B) of the convex lens-shaped first interlayer dielectric 320-1. Here, the size (e.g., the area, such as the length and/or width dimensions) of the center region (A) may be different from the size of the edge region (B).

Figure 3G:
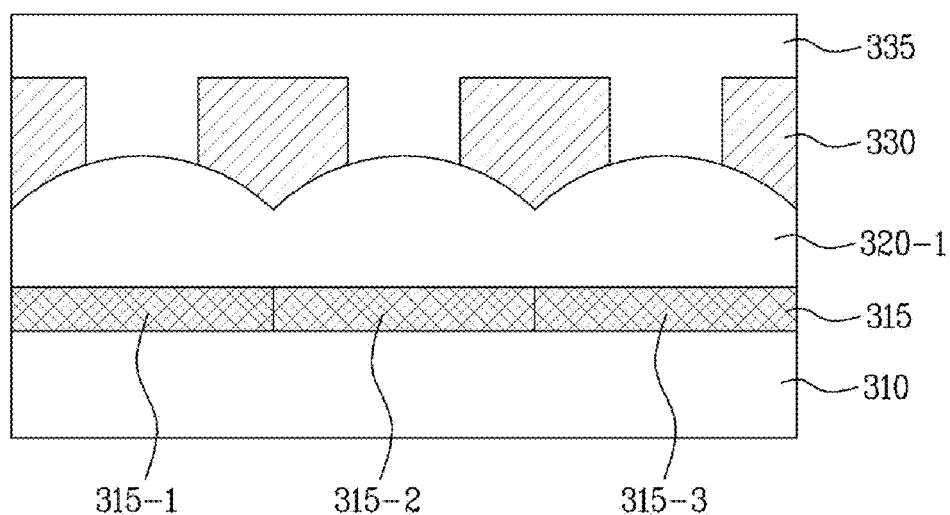

As shown in FIG. 3G, the metal layer 325 is etched using the second photoresist pattern 327 as an etching mask until the convex lens-shaped first interlayer dielectric 320-1 is exposed, to form a first metal line layer 330. After the first metal line layer 330 is formed, the second photoresist pattern 327 is removed.

In reference to FIG. 3G, the metal line layer 330 is formed in a location corresponding to the border regions between neighboring photodiodes. That is, the metal line layer 330 may be formed on the edge region (B) of the first interlayer dielectric 325-1 corresponding to the border region between neighboring photodiodes.

At this time, a backside of the first metal line layer 330 is identical to the backside 242 of the metal line layer (for example, line 240-1 in FIG. 2). In reference to FIG. 2, the backside 242 of the first metal line layer 240-1 includes the apex 244 having a profile substantially identical to the sharp shape of the edge region (B) and the curved surfaces 246 and 248. Here, the first metal line layer 240-1 is formed on the convex lens-shaped first interlayer dielectric 320-1, and thus, the curved surfaces 246 and 248 of the first metal line layer 240 are convex inward, or concave.

When the second photoresist pattern 327 is patterned to symmetrically cover the edge region (B) with respect to the border sour interface between neighboring photodiodes, the two curved surfaces 246 and 248 may be formed symmetrical to each other with respect to the vertical line 244-1 passing the apex 244. That is, the vertical line 244-1 passing the apex 244 may be aligned to the border surface between corresponding two neighboring photodiodes 222, 224 and 246. As mentioned in reference to FIG. 2, curved surfaces 246 and 248 of the backside 242 of the first metal line layer 240-1 may be substantially convex inward (or concave). As a result, the light reflected by one (for example, 315-2) of the plurality of the photodiodes 222, 224 and 226 may be re-reflected to the photodiode (for example, 315-2) by the backside 242 of the first metal line layer 240-1.

The present image sensor makes the light reflected from one of the photodiodes re-reflected back to the photodiode by the backside of the metal line layer to enhance sensitivity. In addition, the image sensor may prevent the light reflected by a photodiode from being reflected to another adjacent photodiode, and thus it reduces or prevents crosstalk.

Next, as shown in FIG. 3G, a second interlayer dielectric 335 is formed on the first interlayer dielectric 320-1 having the first metal line layer 330 thereon, and then a CMP process is performed to planarize the second interlayer dielectric 335. The second interlayer dielectric 335 may be as described above for a dielectric layer stack in the interlayer dielectric layer 230 (FIG. 2).

Figure 3H:
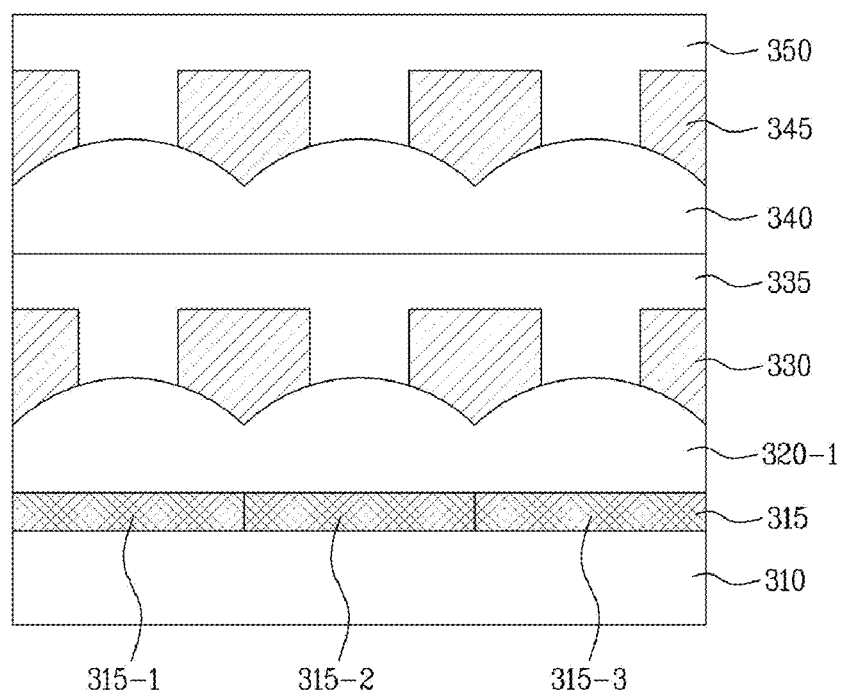

Hence, as shown in FIG. 3H, the process of forming the convex interlayer dielectric and the metal line layer as shown in FIGS. 3B to 3G is repeated to form the convex interlayer dielectric layer 340 and the metal line layer 345. For example, a third interlayer dielectric 340 that contains a plurality of convex lens-shaped structures is formed on the second interlayer dielectric 335, and the second metal line layer 345 is formed on the third interlayer dielectric 340. After that, a fourth interlayer dielectric 350 may be formed and planarized as described herein. Although the two metal line layers 330 and 345 are shown in FIG. 3H, the present invention is not limited thereto.

Figure 3I:
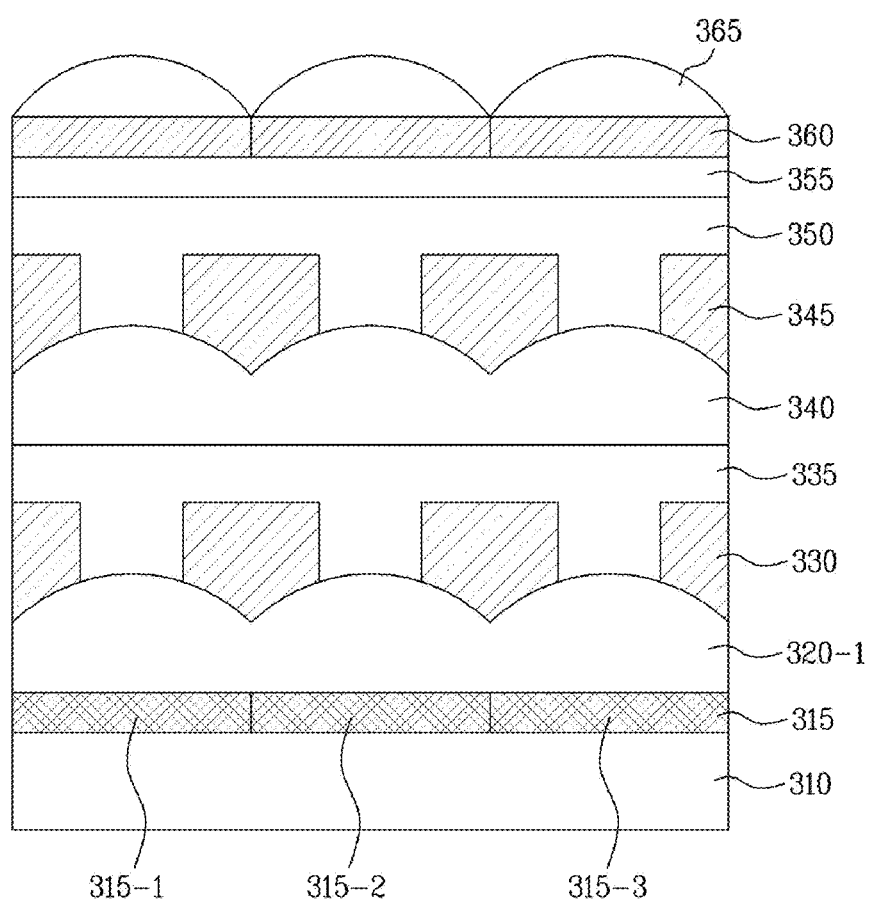

Next, as shown in FIG. 3I, a planarization layer 355 is formed on the fourth interlayer dielectric 350. A color filter layer 360 corresponding to each of the photodiodes 315-1, 315-2 and 315-3 is formed on the planarization layer 355. For example, the color filter layer 360 may include a red color filter, green color filter and blue color filter.

Hence, a microlens 365 (or a plurality of such microlenses) can be formed on the color filter layer 360. The microlenses 365 may be formed corresponding to the red, green and blue color filters. For example, a photoresist pattern (not shown) is formed using the mask for the microlens in a photolithography process. The photoresist pattern (not shown) for forming the microlens is heated in a thermal reflow process (e.g., at a predetermined high temperature) and is hardened enough to form the microlens 365.

It will be apparent to those skilled in the art that various modifications and variations can be made in the present invention without departing from the spirit or scope of the inventions. Thus, it is intended that the present invention covers the modifications and variations of this invention, provided they come within the scope of the appended claims and their equivalents.

What is claimed is:

1. An image sensor comprising:
    a plurality of photodiodes on or in a substrate;
    a dielectric layer formed on the plurality of the photodiodes;
    a metal line layer in or on the dielectric layer corresponding to a border region between neighboring photodiodes, the metal line layer comprising a side toward the photodiodes having a first curved surface concave to a first direction, a second curved surface concave to a second direction, and an apex where the first and second curved surfaces meet, wherein the first direction is from one of the neighboring photodiodes to the metal line layer, and the second direction is from another one of the neighboring photodiodes to the metal line layer;
    a color filter layer on the dielectric layer; and
    a microlens on the color filter layer.

2. The image sensor of claim 1, wherein the first and second curved surfaces are symmetrical with respect to a vertical line passing through the apex.

3. The image sensor of claim 2, wherein the vertical line passing through the apex is aligned to a border surface between the neighboring photodiodes.

4. The image sensor of claim 1, wherein the metal line layer is in a location over an interface between adjacent photodiodes.

5. The image sensor of claim 1, further comprising a plurality of microlenses on the color filter layer.

6. The image sensor of claim 1, wherein each photodiode of said plurality of photodiodes is located on or adjacent to a shallow trench isolation structure located on or in the substrate.

7. The image sensor of claim 1, further comprising a second metal line layer in or on said dielectric layer corresponding to the border region between neighboring photodiodes.

8. The image sensor of claim 7, wherein the second metal line layer comprises a side toward the photodiodes having third and fourth curved surfaces and an apex where the third and fourth curved surfaces meet.

9. The image sensor of claim 1, further comprising a second dielectric layer, wherein the second metal line layer is in or on said second dielectric layer.

10. The image sensor of claim 1, wherein the side of the metal line layer toward the photodiodes has a third curved surface concave to a third direction, and a fourth curved surface concave to a fourth direction, the apex being where the first, second, third and fourth curved surfaces meet, wherein the third direction is from a third one of the neighboring photodiodes to the metal line layer, and the fourth direction is from a fourth one of the neighboring photodiodes to the metal line layer.

11. The image sensor of claim 1, wherein the dielectric layer comprises an oxide, a nitride, or a combination thereof.

12. The image sensor of claim 1, wherein the metal line layer comprises titanium, aluminum, tantalum, titanium nitride, or any combination thereof.

13. The image sensor of claim 1, wherein the color filter layer comprises a plurality of red color filters, green color filters, blue color filters, or a combination thereof.

14. The image sensor of claim 1, wherein the color filter layer comprises a plurality of yellow color filters, cyan color filters, magenta color filters, or a combination thereof.

15. The image sensor of claim 5, wherein a unique one of the plurality of microlenses is on a unique one of the plurality of color filters, and each unique color filter is over a unique one of the plurality of the photodiodes.

* * * * *